US007777490B2

(12) United States Patent
Haans et al.

(10) Patent No.: US 7,777,490 B2
(45) Date of Patent: Aug. 17, 2010

(54) RF ANTENNA WITH INTEGRATED ELECTRONICS

(75) Inventors: Paulus Cornelius Hendrikus Adrianus Haans, Best (NL); Marc Paul Saes, Beek En Donk (NL); Gosta Jakob Ehnholm, Vantaa (FI)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/089,053

(22) PCT Filed: Oct. 10, 2006

(86) PCT No.: PCT/IB2006/053718

§ 371 (c)(1),
(2), (4) Date: Sep. 19, 2008

(87) PCT Pub. No.: WO2007/043009

PCT Pub. Date: Apr. 19, 2007

(65) Prior Publication Data

US 2009/0121717 A1    May 14, 2009

(30) Foreign Application Priority Data

Oct. 11, 2005 (EP) .................................. 05109413

(51) Int. Cl.
*G01V 3/00* (2006.01)
(52) U.S. Cl. ..................................................... 324/318
(58) Field of Classification Search ......... 324/300–322; 600/410–435; 333/219–235; 343/703, 720–730, 343/741–752, 756
See application file for complete search history.

(56) References Cited

U.S. PATENT DOCUMENTS 4,704,739 A * 11/1987 Murakami et al. .......... 455/325
5,280,246 A *  1/1994 Takahashi et al. .......... 324/322

(Continued)

FOREIGN PATENT DOCUMENTS

JP         2003210432 A       7/2003

(Continued)

OTHER PUBLICATIONS

Oschmann, E.; Wireless Access Method and Physical Layer Specifications; 1993; Internet (PCT search) URL:grouper.ieee.org/groups/802/11/Documents/DocumentArchives/1993_docs/1193057.doc.

(Continued)

*Primary Examiner*—Brij B Shrivastav
*Assistant Examiner*—Dixomara Vargas (57) ABSTRACT

A radio frequency antenna comprising a resonant pickup circuit (102) arranged to pick up a magnetic resonance signal, an analog-to-digital converter (105) arranged to convert the magnetic resonance signal to digital data, and a frequency converter arranged to convert a primary band of frequencies of the digital data. By upshifting the frequency of the transmitted bit-stream, it is possible to RF-trap the transmission channel (109) by simple high-pass filtering techniques. In case the transmitted bit pattern has frequency components that approach the resonance frequency, an encoding technique like Manchester encoding can be used to eliminate unwanted signals.

9 Claims, 9 Drawing Sheets

U.S. PATENT DOCUMENTS

| | | | |
|---|---|---|---|
| 5,296,813 | A | 3/1994 | Holmes et al. |
| 5,384,536 | A * | 1/1995 | Murakami et al. ........... 324/309 |
| 5,491,415 | A | 2/1996 | Holmes et al. |
| 5,594,341 | A | 1/1997 | Majidi-Ahy et al. |
| 6,696,835 | B2 * | 2/2004 | Goto ........................ 324/307 |
| 6,844,730 | B2 | 1/2005 | Feld et al. |
| 7,400,148 | B2 * | 7/2008 | Adachi, Kohei ............ 324/322 |
| 7,417,433 | B2 * | 8/2008 | Heid et al. ................. 324/318 |
| 2002/0079892 | A1 | 6/2002 | Baumgartl et al. |
| 2003/0078004 | A1 | 4/2003 | Vester |

FOREIGN PATENT DOCUMENTS

| | | |
|---|---|---|
| WO | 03032002 A1 | 4/2003 |
| WO | 2004089211 A2 | 10/2004 |

OTHER PUBLICATIONS

Sethi, M., et al.; Digitising the wireless mri link: a space-time cdma approach; 2001; IEEE Trans. on Intelligent Information Systems Conference; pp. 31-36.

* cited by examiner

RF ANTENNA WITH INTEGRATED ELECTRONICS

The invention relates to a radio frequency (RF) antenna comprising a resonant pickup circuit arranged to pick up a magnetic resonance (MR) signal at a measured frequency and an analog-to-digital converter (ADC) arranged to convert the MR signal to digital data.

The invention further relates to an MR imaging system comprising such an RF antenna.

The invention further relates to a method of receiving an MR signal by such an RF antenna, the method comprising the steps of picking up an MR signal and converting the MR signal to digital data.

An embodiment of such an RF antenna is described in U.S. Pat. No. 5,491,415, which discloses an embodiment of an RF coil used in an MR imaging apparatus, the RF coil comprising signal processing circuits, including an array of unpackaged component dice that is mounted on the coil. In one embodiment, the component dice include an ADC for digitizing the received MR signals at the coil before noise signals received along connecting leads are superimposed.

A problem with the prior art is that transmission of signals from the RF antenna is sensitive to common mode coupling. For example, in an MR system, common mode noise signals can appear in a cable as the result of capacitive coupling of nearby electric fields, inductive coupling of local magnetic fields, or electromagnetic coupling of RF signals in space.

It is an object of the invention to provide an RF antenna that is less sensitive to common mode coupling.

This object is achieved by an RF antenna according to the opening paragraph, wherein the RF antenna further comprises a frequency converter arranged to convert a primary band of frequencies of the digital data, wherein the primary band of frequencies comprises the measured frequency. The frequency converter comprises electronic circuitry to convert the frequency components in the primary band of frequencies to a converted band of frequencies substantially different from the measured frequency. Examples of the measured frequency include the Larmor frequency of a nuclear species, the electron spin resonance frequency, etc. If the converted frequency band is sufficiently shifted away from the measured frequency, common mode coupling can be removed using simple filtering techniques.

This and other aspects of the invention will be elaborated further on the basis of the following embodiments, which are defined in the dependent claims.

In an embodiment of the RF antenna according to the invention, the RF antenna further comprises an insulating substrate, wherein the resonant pickup circuit, the analog-to-digital converter and the frequency converter are comprised on the insulating substrate. By minimizing the distance between various components by including them on the same substrate, common mode coupling can be reduced further. As a result, filtering out unwanted signals, and getting back the original signal picked up by the resonance pickup circuit becomes more efficient.

In a further embodiment of the RF antenna according to the invention, the frequency converter is arranged to convert the primary band of frequencies of the digital data to a converted band of frequencies that is substantially higher than the measured frequency. If the upconverted frequency band is sufficiently removed from the measured frequency, common mode coupling in the RF range can be removed using simple high-pass (HP) filtering techniques.

In a further embodiment of the RF antenna according to the invention, the RF antenna further comprises an encoder to encode the digital data. When the acquired MR signal is digitized by the ADC and transmitted, it is possible that a bit pattern of the digitized MR signal has frequency components in the range of the original measured frequency. In this case, the HP filter would have to have a cut-off frequency that is close to the measured frequency, so as to effectively trap or filter out the common-mode currents. Encoding the digital data bit-stream appropriately would increase the frequency components in the bit-stream so that the HP filter cut-off frequency is sufficiently shifted away from the measured frequency. Thus, the effectiveness of a simple HP filtering technique in reducing or eliminating common mode coupling is enhanced. Some examples of known encoding techniques include Manchester encoding, 8/10 encoding, etc.

In a further embodiment of the RF antenna according to the invention, the RF antenna further comprises a demodulator circuit to demodulate and recover the digital data. The demodulator circuit comprises a digital down converter capable of shifting the converted band of frequencies of the bit stream back to the primary band of frequencies. The demodulator circuit could further comprise a decoder circuit that reverses the effect of the encoder, thereby recovering the digital data. As an example, including the demodulator and decoder circuits on-board the RF antenna further ensures that distances between components are minimized. This reduces the chances of common mode coupling in the lines carrying the digitized and/or encoded signal. The shorter distance also reduces the number of HP filters required along the electrical connection.

In a further embodiment of the RF antenna according to the invention, the RF antenna further comprises an optical driver circuit to convert the digital data into optical signals. The optical signals may now be transmitted via optical cables to receivers situated in a remote location.

It is a further object of the invention to provide an MR imaging system that is less sensitive to common mode coupling in the RF range.

This object is achieved by providing the MR imaging system with an RF antenna according to the opening paragraph, wherein the RF antenna further comprises a frequency converter arranged to convert a primary band of frequencies of the digital data, wherein the primary band of frequencies comprises the measured frequency.

It is a further object of the invention to provide a method of converting a frequency band of acquired magnetic resonance signal, such that the converted signal is less sensitive to common mode coupling in the RF range.

This object is achieved by a method of converting a primary band of frequencies of the MR signal received by an RF antenna according to the opening paragraph, the method further comprising the step of converting the primary band of frequencies of the digital data by using a frequency converter, wherein the primary band of frequencies comprises the measured frequency.

These and other aspects of the invention will be described in detail hereinafter, by way of example, on the basis of the following embodiments, with reference to the accompanying drawings, wherein FIG. 1 schematically shows an RF antenna according to the invention, FIG. 2 schematically shows an embodiment of the invention, where the resonant pickup circuit, the analog-to-digital converter and the frequency converter are arranged on an insulating substrate, FIG. 3 schematically shows a further embodiment of the invention, where the digital signal is shifted higher in frequency such that it contains frequency components that are substantially higher than a measured frequency, FIG. 4 schematically shows a further embodiment of the invention, where the digital signal is advantageously encoded, FIG. 5 schematically shows a further embodiment of the invention, where the modulated and/or encoded digital data is demodulated and/or decoded, respectively, FIG. 6 schematically shows a further embodiment of the invention, where the outputs of multiple analog-to-digital converters are multiplexed or added using a multiplexer/summer circuit, FIG. 7 schematically shows an MR imaging system comprising an RF antenna according to the invention, FIG. 8 schematically shows a method of converting a primary band of frequencies of a magnetic resonance signal to a converted band of frequencies, and FIG. 9 schematically shows a method of computing a mathematical product that determines the rate of transmission of digital data.

It may be noted that corresponding reference numerals used in the various Figures represent corresponding structures in the Figures.

Figure 1:
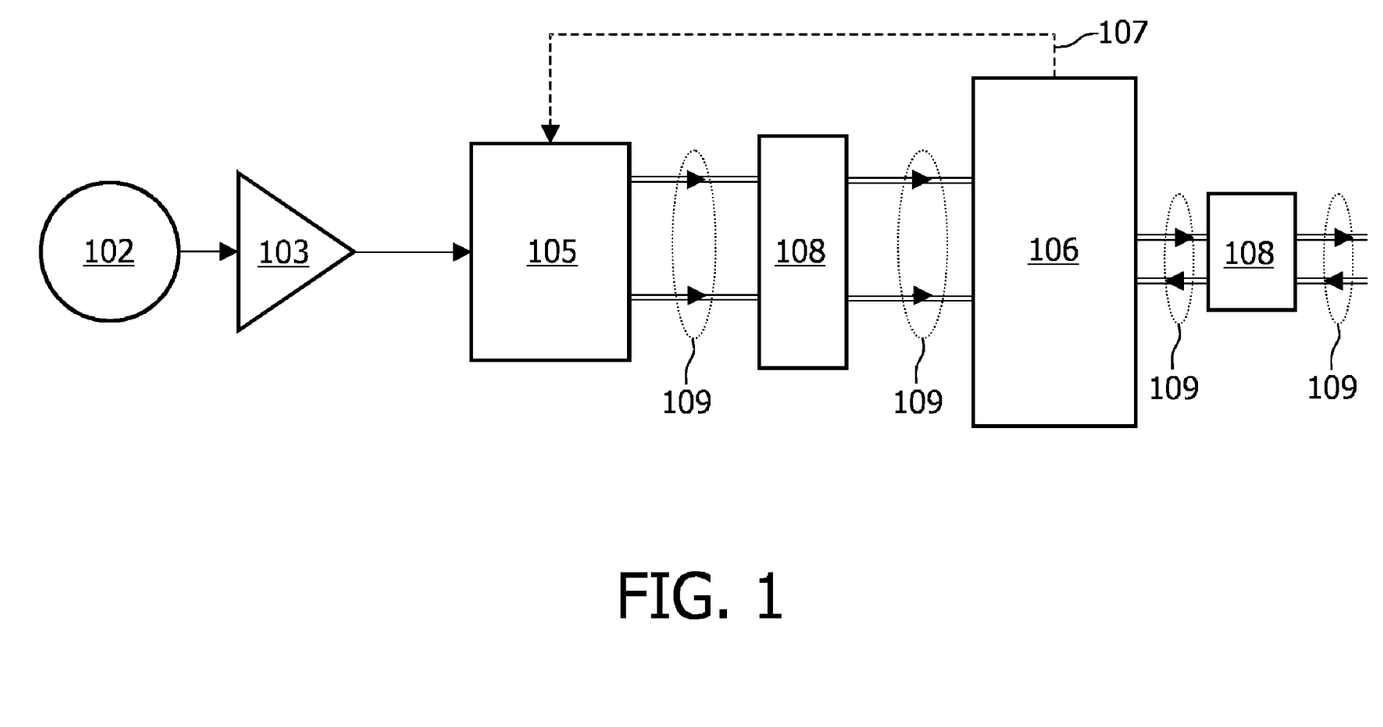

FIG. 1 is a block diagram of the RF antenna according to the invention, the RF antenna comprising a sensing element 102, a pre-amplifier 103, an ADC circuit 105, a summer circuit 106 and a filter 108. The clock rate of the ADC circuit 105 and the adder circuit 106 is synchronized to the system clock as denoted by the arrow 107. The outputs of the ADC circuit 105 and of the summer circuit 106 are low voltage differential signals (LVDS) transmitted via LVDS conduits 109.

The RF antenna comprises a resonant circuit formed by the sensing element 102, for example, a surface coil in the form of a looped wire, or a birdcage coil, etc. The sensing element 102 picks up MR signals from an object of interest, for example, a region of interest of a patient. The preamplifier 103, also referred to as a low noise amplifier or LNA, amplifies the MR signals, which are then digitized by the ADC circuit 105. The ADC 105 and the summer or adder circuit 106 also serialize the digitized MR signal before transmitting it via the LVDS conduit 109. The filters 108 filter out unwanted signals, including possible common mode signals in the RF range. Depending on the amount of interference from external signals, as well as on the length of the LVDS conduit 109, multiple filters 108 may be required along the LVDS conduit 109.

The serialized LVDS are transmitted at a rate determined by the number of ADCs 105 multiplied by the number of bits per ADC multiplied by the ADC clock rate. Thus, the ADC circuit 105, together with the summer circuit 106, and associated connections, form a digital frequency converter for the MR signal. Typical values for the various parameters mentioned above are 2 ADCs 105 per sensing element 102, with 16 bits per ADC, and a clock rate of 50 MHz, giving a typical transmission rate of 1600 Mbits/sec. The above set of parameters is given only as an example; other configurations will work just as well for the invention.

Figure 2:
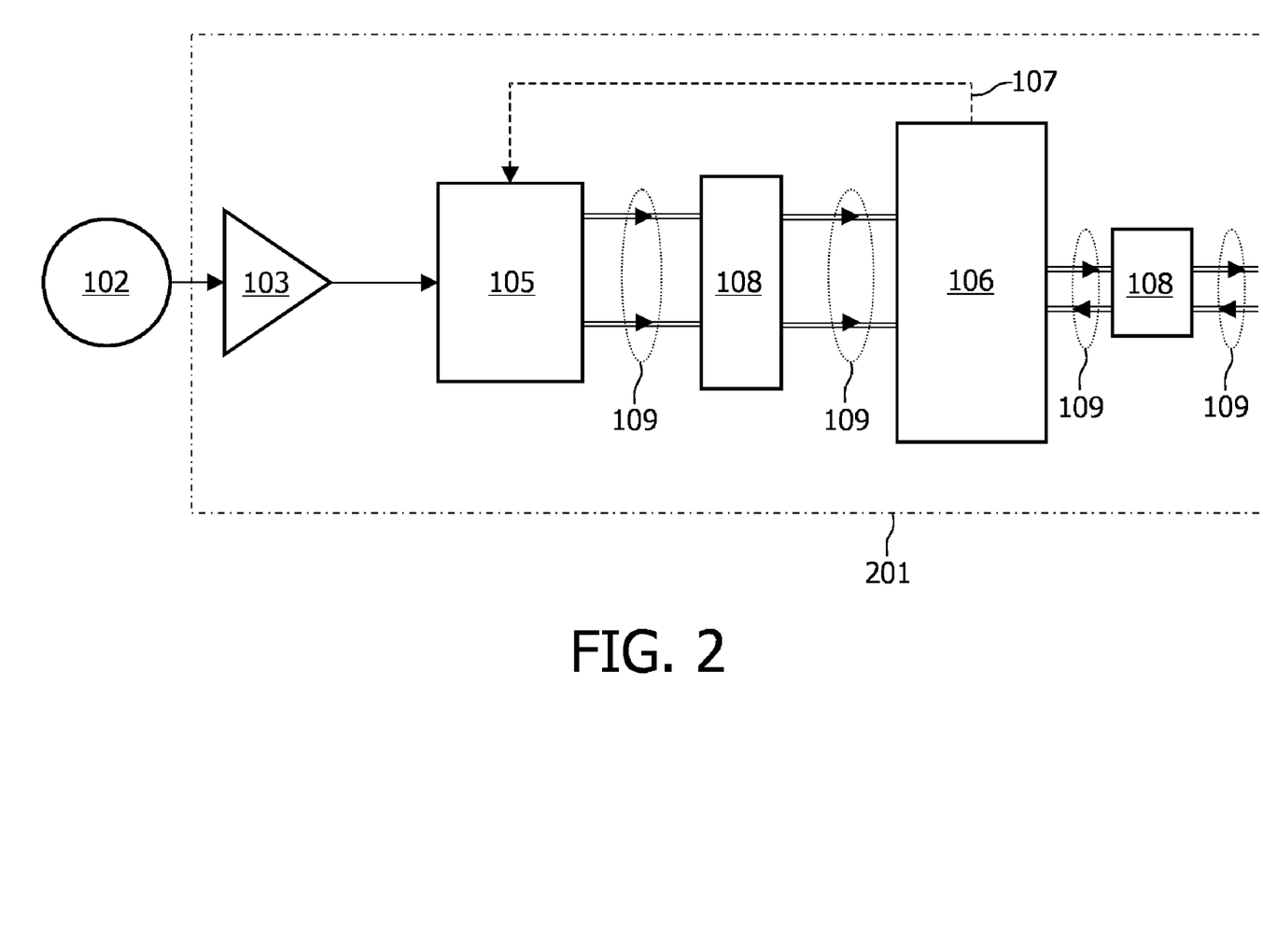

FIG. 2 shows a further embodiment of the RF antenna according to the invention, the RF antenna comprising a sensing element 102, a pre-amplifier 103, an ADC circuit 105, a summer circuit 106, a filter 108, and an insulating substrate 201. The clock rate of the ADC circuit 105 and the summer circuit 106 is synchronized to the system clock as denoted by the arrow 107. The outputs of the ADC circuit 105 and of the summer circuit 106 are low voltage differential signals (LVDS) transmitted via an LVDS conduit 109.

The pre-amplifier 103, the ADC circuit 105, the adder circuit 106, and filters 108, are formed on the insulating substrate 201. It is also possible to form the sensing element 102 also on the insulating substrate 201. It may be noted that multiple insulating substrates could be used to form the circuit, with proper interconnections between the various components as shown in the Figure. Forming the various components on a substrate has the advantage of reducing the length of the various connections 109. This will further reduce interference from external signals, including common mode coupling in the RF range, as well as reduce the need for multiple filter stages 108. However, depending on the amount of interference from external signals, as well as on the length of the LVDS conduit 109, multiple filters 108 may still be required along the LVDS conduit 109.

Figure 3:
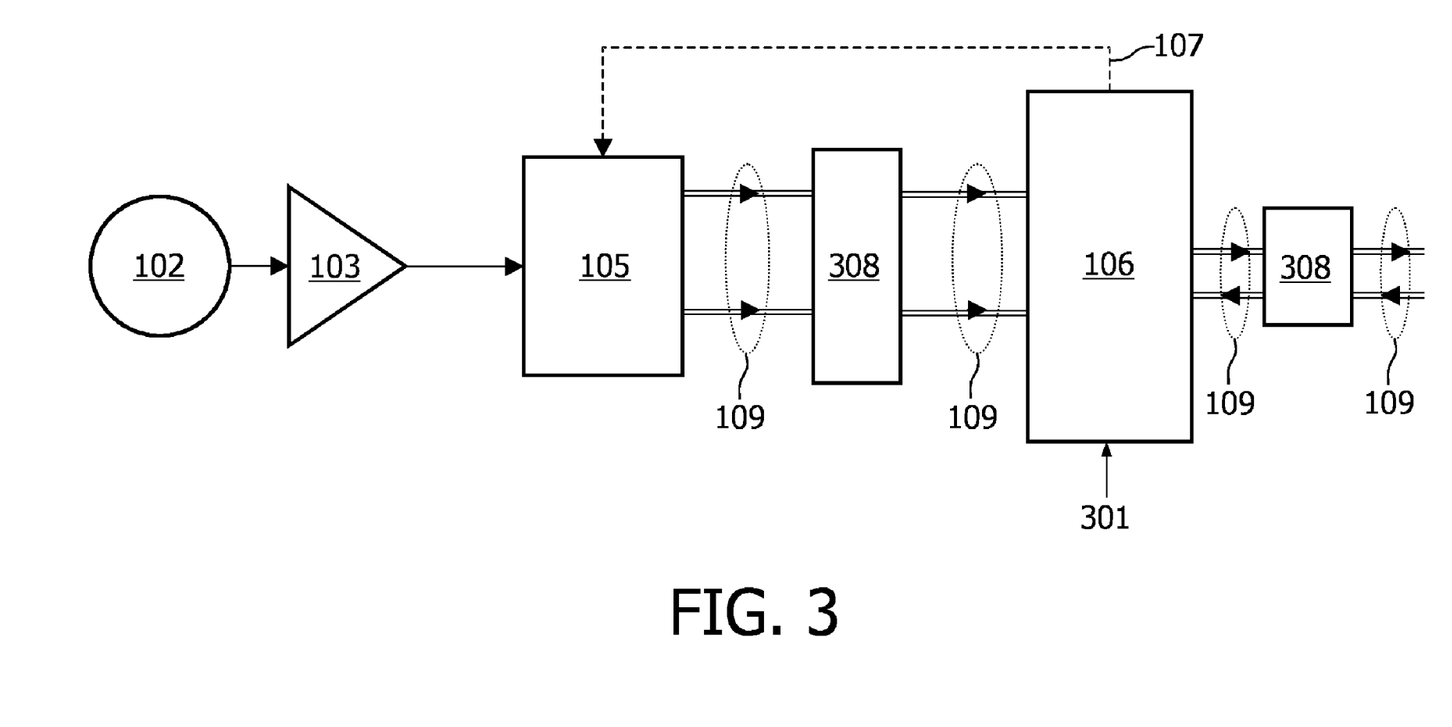

FIG. 3 shows a further embodiment of the RF antenna according to the invention, the RF antenna comprising a sensing element 102 with its associated circuitry, including an LNA 103, one or more ADC circuits 105, a summer circuit 106, and high-pass filters 308. An adjuster signal 301 to adjust the clock frequency of the summer circuit 106 is also provided. The one or more ADC units 105 are synchronized to the clock frequency of the summer circuit as denoted by the arrow 107.

For an exemplary configuration of the RF antenna, the number of ADCs 105, as well as the number of bits per ADC may be fixed. The clock rate, however, may be variable. Thus, one method of shifting the frequency involves adjusting the clock rate of the ADCs 105 to a sufficiently high value. Signals in the upshifted frequency range transmitted via the LVDS conduit 109 may be filtered or "RF-trapped" by means of HP filtering. The clock rate of the ADCs 105 is synchronized with the clock rate of the summer circuit 106 as denoted by the arrow 107. The adjuster signal 301 could be derived, for example, from a clock generating circuit (not shown) comprising a numerically controlled oscillator or a voltage controlled oscillator, etc. Clock generating circuits are known in prior art.

It may be noted that other techniques of shifting the frequency, such as interpolation techniques like zero padding followed by appropriate filtering, etc. could also be used to upshift the frequency in alternative implementations of the invention.

Figure 4:
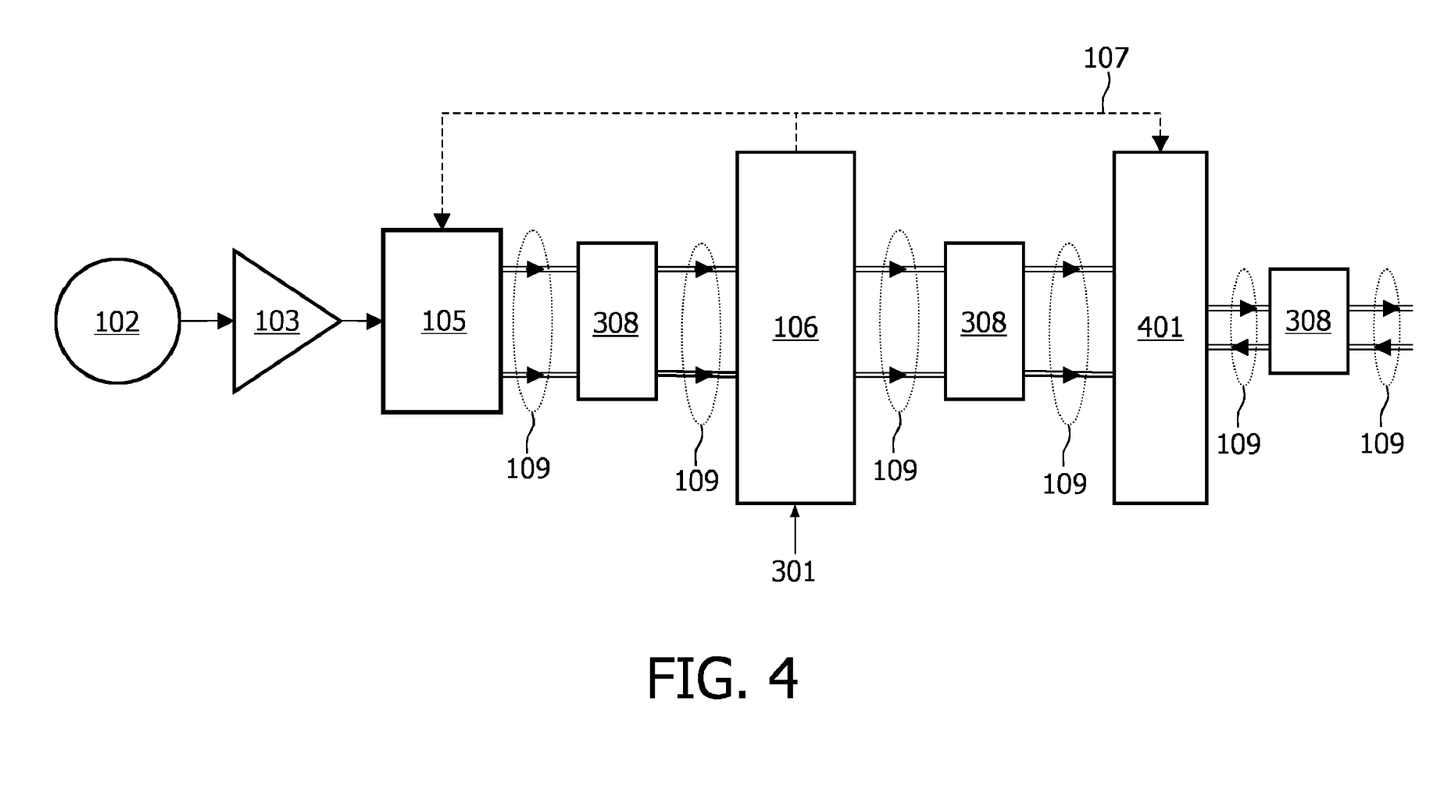

FIG. 4 shows a further embodiment of the RF antenna according to the invention, the RF antenna comprising a sensing element 102 with its associated circuitry, including an LNA 103, an ADC circuit 105, a summer circuit 106, HP filters 308, and an encoder 401. An adjuster signal 301 to adjust the clock frequency of the summer circuit 106 is also provided. The ADC unit 105 and the encoder 401 are synchronized to the system clock as denoted by the arrow 107.

Due to the digitization and the serialization of the MR signals, it is possible that the transmitted bit pattern in the LVDS conduit 109 contains frequency components that are close to the original Larmor frequency sampled by the sensing element 102. For example, let us consider a bit length per sample of 24 bits. If the sampling frequency is 50 MHz, the bit transport rate would be 24×50=1.2 Gbits/s. Depending on the values of the various bits, the resulting waveform could have various frequency components, ranging from 0 Hz to 600 MHz. If a bit length per sample of 48 bits is considered, then, at the same sampling frequency of 50 Hz, the frequency components in the resulting bit stream could range from 0 Hz to 1.2 GHz. These calculations are shown in further detail in Table 1.

TABLE 1

| Sample Length | Bit Pattern | Frequency of bit stream | |
|---|---|---|---|
| 24 bits | 000000000000000000000000 | 0 | Hz |
| | 101010101010101010101010 | 600 | MHz |
| | 100000000000000000000000 | 50 | MHz |
| | any bit pattern | 0 to 600 | MHz |
| 48 bits | 000000000000000000000000000000000000000000000000 | 0 | Hz |
| | 100000000000000000000000000000000000000000000000 | 25 | MHz |
| | any bit pattern | 0 to 1.2 | GHz |

To obtain a bit pattern having an equivalent bandwidth in the range of the Larmor frequency of hydrogen nucleus (proton or $^1$H), which resonates at around 64 MHz at 1.5 T, the bit stream should have about 19 adjacent 1s and 0s per section of the bit stream considered. To be able to effectively transport such a waveform over the LVDS link 109, the HP filters 308, designed to trap common mode currents or voltages, should have a cut-off frequency that is close to 64 MHz. This might lead to high capacitance values for the HP filter 308, which could drastically reduce the efficiency of the common-mode trapping.

When a bit pattern comprising approximately 19 consecutive 1s or 0s is transmitted over the LVDS conduit 109, the sensing element 102, due to its proximity to the LVDS conduit 109, may additionally receive a signal from the LVDS conduit 109. This signal may again be digitized and serialized, and re-transmitted via the LVDS conduit 109. Thus, an undesirable feedback loop is formed if the transmitted LVDS contains frequencies in the range of the original resonance frequency. In order to be able to filter out such an undesirable feedback signal, an encoder 401 encodes the digitized signal before it is transmitted over the LVDS conduit 109. The encoding technique typically shifts the frequency of the transmitted bit stream away from the resonance frequency of the spins being imaged, thus preventing the tuned RF sensing element 102 from picking up a signal from the transmitted bit stream. Examples of possible encoding techniques include non-return-to-zero (NRZ) encoding techniques. For example, the Manchester encoding technique would break any pattern of consecutive 1s or 0s, by introducing more transitions into the waveform, and as a consequence, would increase the frequency of the bit stream.

Figure 5:
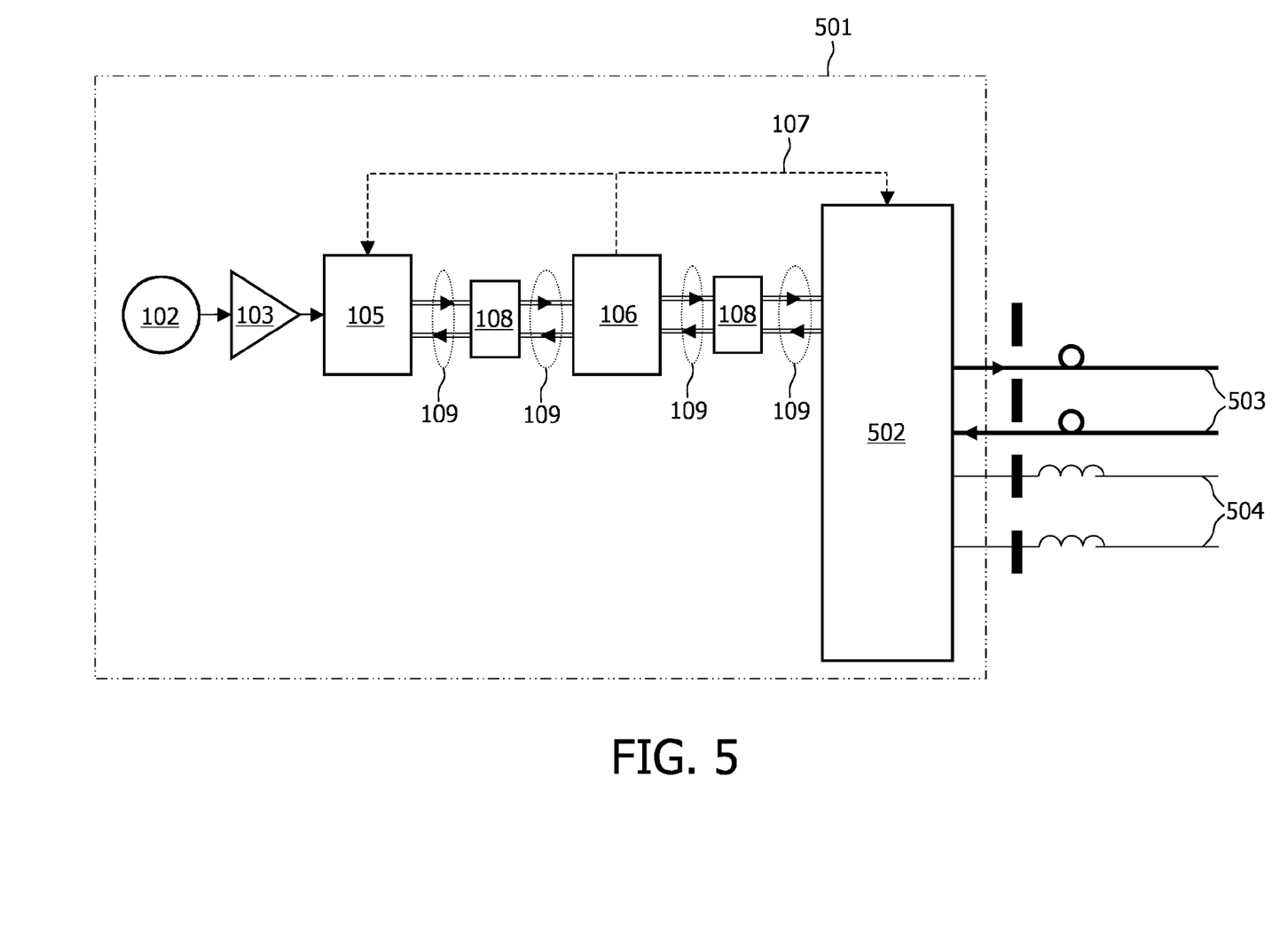

FIG. 5 shows an embodiment of an RF receiver 501 comprising an RF antenna according to the invention, the RF antenna comprising a sensing element 102, a pre-amplifier 103, an ADC circuit 105, a summer circuit 106 that is connected to additional electronic circuitry 502 via filters 108. The additional circuitry 502 comprising, for example, a digital down converter or DDC, a system clock recovery circuit, a decoder circuit, an adder circuit, an optical driver circuit etc., provides a means to recover the original digitized MR signal. It also provides an arrangement to connect the RF receiver 501 to the external world, via electrical wires 504, optical fiber cables 503, or in a wireless manner, etc. The clock rate of the ADC circuit 105 is synchronized to the system clock as denoted by the arrow 107. The sensing element 102 together with the associated pre-amplifier 103, the ADC circuit 105, the summer circuit 106, the filters 108 and the additional circuitry 502 comprising the demodulator, the system clock recovery or synchronization circuit, the decoder circuit, the adder circuit, the optical driver circuit, etc., preferably form an integral part of the RF antenna. Alternatively, the additional circuitry 502 could be placed at a location remote from the RF antenna, and connected to the RF antenna through filters 108. Depending on the amount of interference from external signals, as well as on the length of the LVDS conduit 109, multiple filters 108 may be required along the LVDS conduit 109. The RF receiver 501 could comprise multiple RF antennae, each comprising a sensing element 102 and associated circuitry as explained above.

Figure 6:
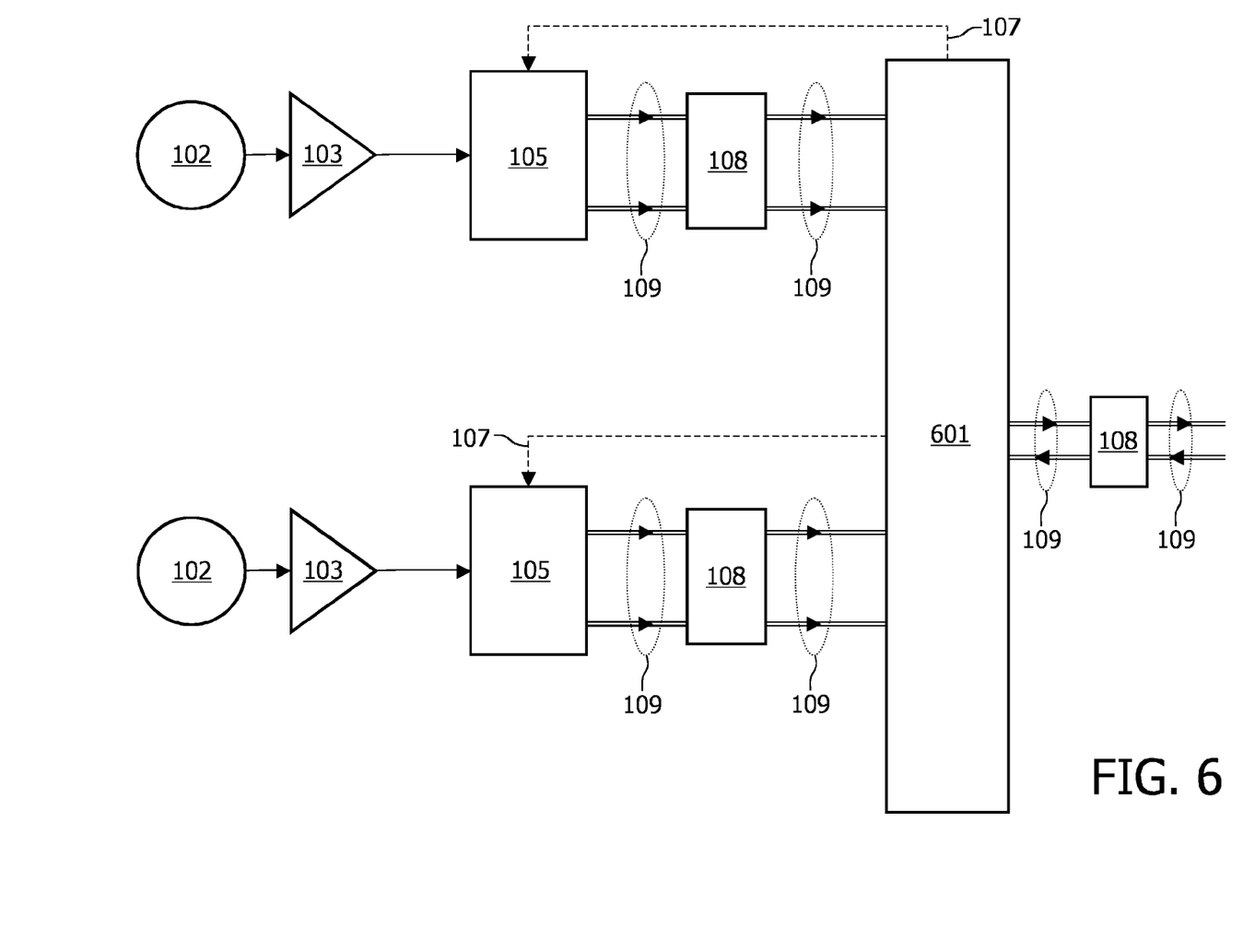

FIG. 6 shows a further embodiment of the RF antenna according to the invention, the RF antenna comprising multiple sensing elements 102, along with associated electronic circuitry, including multiple LNAs 103 and multiple ADCs 105, connected to a multiplexer/adder circuit 601 through filters 108. The clock rates of the ADC circuits 105 are synchronized to the system clock as denoted by the arrows 107. The outputs of the ADC circuits 105 and of the multiplexer/adder circuit 601 are low voltage differential signals (LVDS) transmitted via LVDS conduits 109.

The multiplexer/adder circuit 601 could enable switching between various sensing elements 102 as, for example, in the case of a phased array coil. Thus, different regions of a patient could be advantageously scanned without moving the patient. The multiplexer/adder circuit 601 could alternatively function as an adder circuit, in which case the outputs of multiple sensing elements 102 are summed, for example, to increase the signal-to-noise ratio. The multiplexer/adder circuit 601 could also function in a mixed mode, where it allows selection of separate sensing elements 102 and also allows their outputs to be summed. It may be noted that it is particularly advantageous to provide filters 108 at the outputs of the ADCs 105 in configurations comprising multiple sensing elements 102, as the common-mode coupling between various sensing elements 102 will need to be RF-trapped as well. The multiplexer/adder unit 601 may be an integral part of the RF antenna. Alternatively, the multiplexer/adder unit 601 could be at a location remote from the sensing elements 102, and suitably connected as shown in the Figure. Depending on the length of the LVDS conduit, and the strength of external interfering signals, multiple filter stages 108 may be used at each ADC 105 output.

Figure 7:
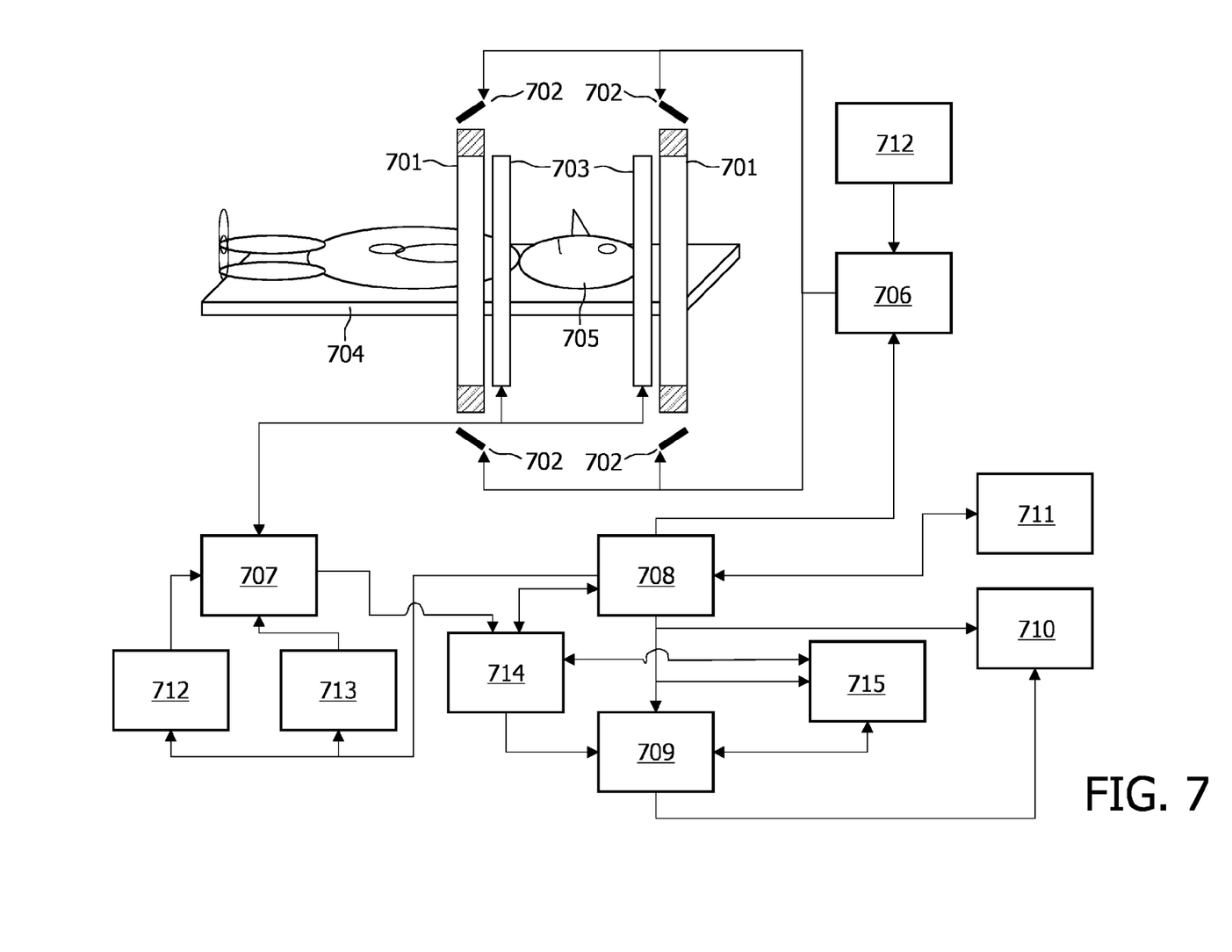

FIG. 7 is a block diagram of an MR imaging system comprising an RF antenna according to the invention. The MR imaging system comprises a set of main coils 701, multiple gradient coils 702 connected to a gradient driver unit 706, and RF coils 703 connected to an RF coil driver unit 707. The function of the RF coils 703, which may be integrated into the magnet in the form of a body coil or may be separate surface coils, is further controlled by a transmit/receive (T/R) switch 713. The multiple gradient coils 702 and the RF coils are powered by a power supply unit 712. A transport system 704, for example a patient table, is used to position the object of interest 705, for example a patient, within the MR imaging system. A control unit 708 controls the operation of a reconstruction unit 709, a display unit 710, for example a monitor screen or a projector, a data storage unit 714, an optical conversion unit 714, and a user input interface unit 711, for example, a keyboard, a mouse, a trackball, etc.

The main coils 701 generate a steady and uniform static magnetic field, for example, of field strength 1 T or 1.5 T. The invention is applicable to any other field strength as well. The main coils 701 are arranged in such a way that they typically enclose a tunnel-shaped examination space into which an object of interest 705 may be introduced. Another common configuration comprises opposing pole faces with an air gap in between them into which the object of interest 705 may be introduced by using the transport system 704. To enable MR imaging, temporally variable magnetic field gradients superimposed on the static magnetic field are generated by the multiple gradient coils 702 in response to currents supplied by the gradient driver unit 706. The power supply unit 712, fitted with electronic gradient amplification circuits, supplies currents to the multiple gradient coils 702, as a result of which gradient pulses (also called gradient pulse waveforms) are generated. The control unit 708 controls the characteristics, notably the strengths, durations and directions, of the currents flowing through the gradient coils to create the appropriate gradient waveforms. The RF coils 703 generate RF excitation pulses in the object of interest 705 and receive MR signals generated by the object of interest 705 in response to the RF excitation pulses. The RF coil driver unit 707 supplies current to the RF coil 703 to transmit the RF excitation pulse, and amplifies the MR signals received by the RF coil 703. The transmitting and receiving functions of an RF coil or set of RF coils are controlled by the control unit 708 via the T/R switch 713. The T/R switch 713 is provided with electronic circuitry that switches the RF coil between transmit and receive modes, and protects the RF coil and other associated electronic circuitry against breakthrough or other overloads, etc. The characteristics of the transmitted RF excitation pulses, notably their strength and duration, are controlled by the control unit 708. It is to be noted that although the transmitting and receiving coil are shown as one unit in this embodiment, it is also possible to have separate coils for transmission and reception, respectively. It is further possible to have multiple RF coils 703 for transmitting or receiving or both. The RF coils 703 may be integrated into the magnet in the form of a body coil, or may be separate surface coils. They may have different geometries, for example, a birdcage configuration or a simple loop configuration, etc. The control unit 708 is preferably in the form of a computer that includes a processor, for example a microprocessor. The control unit 708 controls, via the T/R switch 713, the application of RF pulse excitations and the reception of MR signals. User input interface devices 711 like a keyboard, mouse, touch-sensitive screen, trackball, etc., enable an operator to interact with the MR imaging system.

The demodulated and decoded MR signals are received by an optical conversion unit 714, which converts the optical signals into electrical signals. The converted electrical signal contains the actual information concerning the local spin densities in a region of interest of the object of interest 705 being imaged. The received signals are reconstructed by the reconstruction unit 709, and displayed on the display unit 710 as an MR image. It is alternatively possible to store the signal from the reconstruction unit 709 in a storage unit 715, while awaiting further processing. The reconstruction unit 709 is constructed advantageously as a digital image-processing unit that is programmed to derive the demodulated MR signals received from the RF coils 703.

Figure 8:
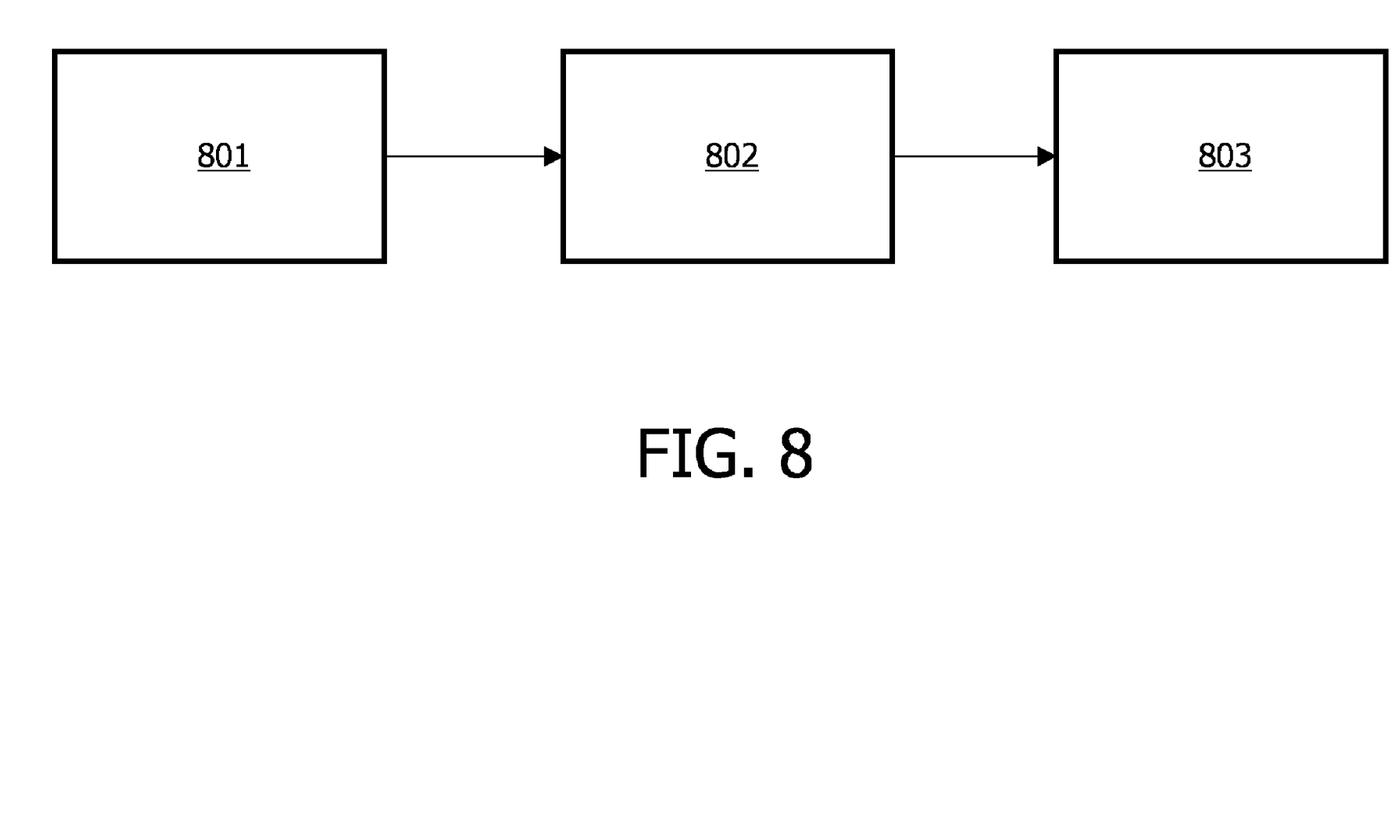

FIG. 8 shows an embodiment of a method of converting a primary band of frequencies of a magnetic resonance signal, the method comprising a step 801 of picking up the magnetic resonance signal at a measured frequency, a step 802 of converting the magnetic resonance signal to digital data, and a step 803 of converting the primary band of frequencies, wherein the primary band of frequencies comprises the measured frequency.

Figure 9:
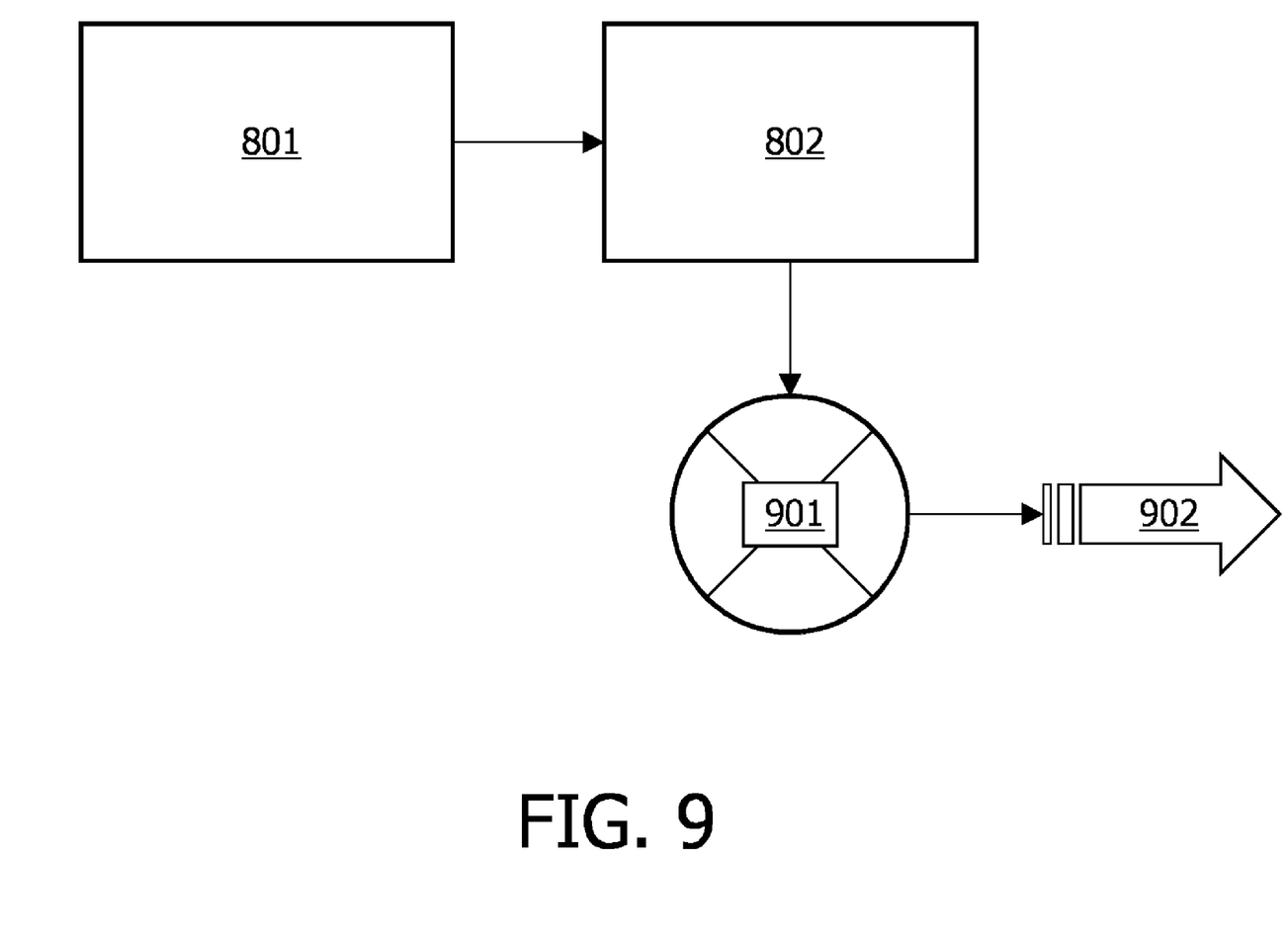

FIG. 9 shows a further embodiment of a method of converting the primary band of frequencies of a magnetic resonance signal to a converted band of frequencies, the method comprising a step 801 of picking up a magnetic resonance signal at a measured frequency, a step 802 of converting the magnetic resonance signal to digital data, a step 901 of multiplying the number of ADCs by the number of bits per ADC circuit and by the clock rate of the ADC circuit to compute a transmitting rate, and a step 902 of serially transmitting the digital data at the transmitting rate. The upper limit of the converted band of frequencies is determined by the rate of transmission of the digital data, while the actual frequency components of the bit stream depend on the data content of the bit stream itself. Examples of the upper limit of the converted band of frequencies, as well as of the actual frequency content of a bit stream, are given in Table 1.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

The invention claimed is:

1. A radio frequency antenna comprising:
   a resonant pickup circuit arranged to pick up a magnetic resonance signal at a measured frequency,
   an analog-to-digital converter arranged to convert the magnetic resonance signal to digital data, and
   a frequency converter arranged to convert a primary band of frequencies of the digital data, wherein the primary band of frequencies comprises the measured frequency, wherein the frequency converter is arranged to convert the primary band of frequencies of the digital data to a converted band of frequencies substantially higher than the measured frequency.

2. A radio frequency antenna as claimed in claim 1, further comprising an insulating substrate, wherein the resonant pickup circuit, the analog-to-digital converter and the frequency converter are comprised on the insulating substrate.

3. A radio frequency antenna as claimed in any one of claim 1, the radio frequency antenna further comprising an encoder to encode the digital data.

4. A radio frequency antenna as claimed in claim 1, the radio frequency antenna further comprising a demodulator circuit to demodulate the digital data.

5. A radio frequency antenna as claimed in claim 3, the radio frequency antenna further comprising an optical driver circuit to convert the digital data into optical signals.

6. A magnetic resonance imaging system comprising a radio frequency antenna as claimed in claim 1.

7. A method of converting a primary band of frequencies of a magnetic resonance signal, the magnetic resonance signal being received by a radio frequency antenna according to claim 1, the method comprising a step of picking up the magnetic resonance signal at a measured frequency using a sensing element, a step of converting the magnetic resonance signal to digital data using an analog-to-digital converter, and a step of converting the primary band of frequencies by using a frequency converter, wherein the primary band of frequencies comprises the measured frequency.

8. A method according to claim 7, the method comprising converting the primary band of frequencies of the magnetic resonance signal to a converted band of frequencies, the method further comprising the steps of computing a mathematical product of
the number of analog-to-digital converters,
the number of bits per analog-to-digital converter circuit, and
the clock rate of the analog-to-digital converter circuit, serially transmitting the digital data at a rate determined by the mathematical product, wherein the upper limit of the converted band of frequencies is determined by the mathematical product.

9. A radio frequency antenna comprising:

a resonant pickup circuit arranged to pick up a magnetic resonance signal at a measured frequency, an analog-to-digital converter arranged to convert the magnetic resonance signal to digital data, and a frequency converter arranged to convert a primary band of frequencies of the digital data, wherein the primary band of frequencies comprises the measured frequency, the radio frequency antenna further comprising an encoder to encode the digital data and an optical driver circuit to convert the digital data into optical signals.

* * * * *